(12) United States Patent
Shen et al.

(10) Patent No.: US 8,359,489 B2
(45) Date of Patent: Jan. 22, 2013

(54) FREQUENCY CALIBRATION CIRCUIT FOR AUTOMATICALLY CALIBRATING A FREQUENCY GENERATED BY AN OSCILLATOR AND METHOD THEREOF

(75) Inventors: Huan-Hsiang Shen, Taipei (TW); Chih-Kao Chen, Taipei County (TW); Chien-Cheng Kuo, Taipei (TW)

(73) Assignee: Etron Technology, Inc., Hsinchu (TW)

( * ) Notice: Subject to any disclaimer, the term of this patent is extended or adjusted under 35 U.S.C. 154(b) by 201 days.

(21) Appl. No.: 12/907,013

(22) Filed: Oct. 18, 2010

(65) Prior Publication Data
US 2012/0056651 A1 Mar. 8, 2012

(30) Foreign Application Priority Data
Sep. 8, 2010 (TW) ................................ 99130302 A

(51) Int. Cl.
*G06F 1/12* (2006.01)
(52) U.S. Cl. ........................ 713/400; 713/502; 710/305

(58) Field of Classification Search .......... 713/400–401, 713/500–503, 600–604; 710/305
See application file for complete search history.

(56) References Cited

U.S. PATENT DOCUMENTS

| 6,542,557 B2* | 4/2003 | Morriss et al. ................ 375/316 |
| 2006/0023824 A1* | 2/2006 | Greco et al. ................... 375/371 |
| 2009/0228746 A1* | 9/2009 | Yang ............................. 714/707 |
| 2010/0122106 A1* | 5/2010 | Lee et al. ....................... 713/503 |
| 2011/0016346 A1* | 1/2011 | Lee et al. ....................... 713/503 |
| 2011/0093736 A1* | 4/2011 | Chiang et al. ................. 713/502 |

* cited by examiner

*Primary Examiner* — Raymond Phan
(74) *Attorney, Agent, or Firm* — Winston Hsu; Scott Margo

(57) ABSTRACT

A serial interface engine generates a series of digital data according to a pair of differential signals received from a high-speed Universal Serial Bus host and/or a full-speed universal serial bus host. Then, a packet identification (PID) unit identifies a packet identification of a start of each frame and a first period between two consecutive packet identifications according to the series of digital data. A count comparator is used for generating a calibration signal to calibrate an output frequency of an oscillator according to the first period.

13 Claims, 4 Drawing Sheets

FREQUENCY CALIBRATION CIRCUIT FOR AUTOMATICALLY CALIBRATING A FREQUENCY GENERATED BY AN OSCILLATOR AND METHOD THEREOF

BACKGROUND OF THE INVENTION

1. Field of the Invention

The present invention is related to a frequency calibration circuit for automatically calibrating frequency and method thereof, and particularly to a frequency calibration circuit and method thereof which utilize a packet identification of a high-speed Universal Serial Bus and/or a packet identification of a full-speed Universal Serial Bus for automatically calibrating frequency.

2. Description of the Prior Art

An oscillator is a significant component found in many electronic products. Periodic waves generated by oscillators may be employed in communication systems, computers or control systems as carriers, timers, counters, or signals with different clocks.

Generally speaking, system vendors widely use less accurate non-crystal oscillators, such as resistor-capacitor (RC) oscillators, instead of crystal oscillators having more accurate oscillation frequencies, such as quartz oscillators, due to lower cost. The prior art uses corrected parameters to program non-volatile memories, such as erasable programmable read only memory (EPROM), electrically-erasable programmable read-only memory (EEPROM), and flash memory, during production of the non-volatile memories, or uses laser-trimming to calibrate the frequency of the RC oscillator. However, the prior art still does not meet a requirement of a high-speed digital system. Therefore, the system vendors are still developing techniques that significantly improve accuracy of oscillation frequencies of the non-crystal oscillators.

SUMMARY OF THE INVENTION

An embodiment of the present invention provides a frequency calibration circuit for automatically calibrating frequency. The frequency calibration circuit includes a serial interface engine, a packet identification unit, an oscillator, and a count comparator. The serial interface engine is used for generating a series of digital data according to a pair of differential signals received from a high-speed Universal Serial Bus (USB) host and/or a full-speed Universal Serial Bus (USB) host. The packet identification unit is used for identifying a packet identification of a start of each frame and a first period between two consecutive packet identifications according to the series of digital data. The count comparator is used for generating a calibration signal to calibrate an output frequency of the oscillator according to the first period.

Another embodiment of the present invention provides a method for automatically calibrating frequency. The method includes generating a series of digital data according to a pair of differential signals received from a high-speed Universal Serial Bus (USB) host and/or a full-speed Universal Serial Bus (USB) host; identifying a packet identification (PID) of a start of each frame according to the series of digital data; and calibrating an output frequency of an oscillator according to a first period between two consecutive packet identifications.

The present invention provides a frequency calibration circuit for automatically calibrating frequency and method thereof. The frequency calibration circuit for automatically calibrating frequency and method thereof utilize a packet identification of a start of frame of a high-speed Universal Serial Bus and/or a full-speed Universal Serial Bus to calibrate an output frequency of an oscillator. Therefore, the present invention can meet requirement of a frequency error of a USB specification version 2.0 without significantly changing the present circuit design.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3A and FIG. 3B are diagrams illustrating determination of packet identifications by the packet identification unit in the full-speed Universal Serial Bus and/or the high-speed Universal Serial Bus.

DETAILED DESCRIPTION

Figure 1:
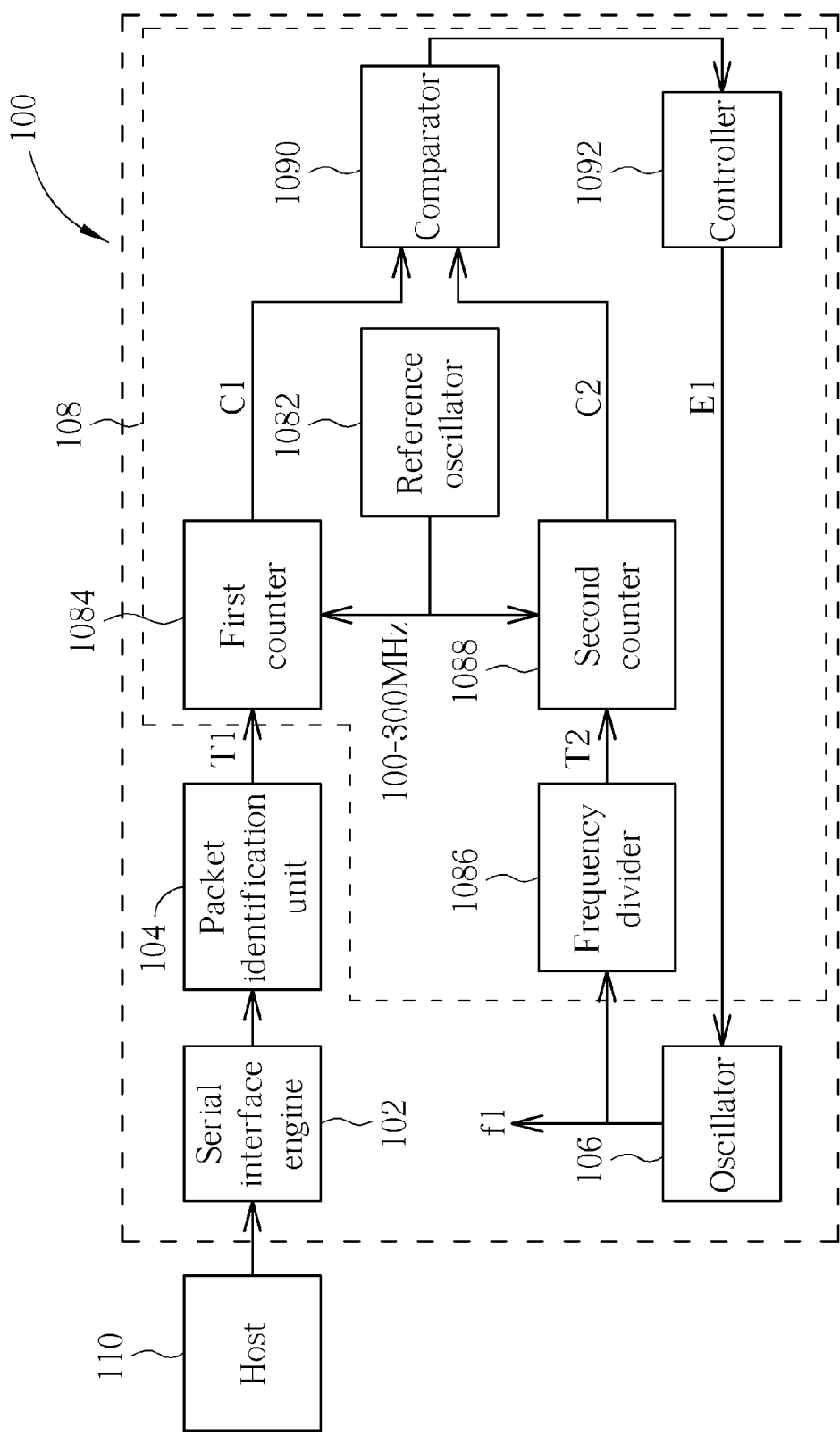
FIG. 1 is a diagram illustrating a frequency calibration circuit for automatically calibrating frequency.

Please refer to FIG. 1. FIG. 1 is a diagram illustrating a frequency calibration circuit 100 for automatically calibrating frequency. The frequency calibration circuit 100 includes a serial interface engine 102, a packet identification (PID) unit 104, and oscillator 106, and a count comparator 108. The serial interface engine 102 is used for generating a series of digital data according to a pair of differential signals received from a high-speed Universal Serial Bus (USB) host 110 and/or a full-speed Universal Serial Bus (USB) host 110. The packet identification unit 104 is coupled to the serial interface engine 102 for identifying a packet identification of a start of each frame and a first period T1 between two consecutive packet identifications according to the series of digital data.

The count comparator 108 coupled to the packet identification unit 104 and the oscillator 106 includes a reference oscillator 1082, a first counter 1084, a frequency divider 1086, a second counter 1088, a comparator 1090, and a controller 1092. The reference oscillator 1082 is coupled to the first counter 1084 and the second counter 1088 for providing the first counter 1084 and the second counter 1088 with a reference oscillation frequency (100 MHz-300 MHz). The first counter 1084 is coupled to the packet identification unit 104 for counting a first number of clocks C1 generated by the reference oscillation frequency of the reference oscillator 1082 during the first period T1. The frequency divider 1086 is coupled to the oscillator 106 for dividing an output frequency (12 MHz) of the oscillator 106 by 3000 (high-speed USB) or 24000 (full-speed USB) to generate a second period T2. The second counter 1088 is coupled to the frequency divider 1086 for counting a second number of clocks C2 generated by the reference oscillation frequency of the reference oscillator 1082 during the second period T2. The comparator 1090 is coupled to the first counter 1084 and the second counter 1088 for generating a comparison result according to a difference between the first number of clocks C1 and the second number of clocks C2. The controller 1092 is coupled to the comparator 1090 for generating a calibration signal E1 to calibrate the output frequency f1 of the oscillator 106 according to the comparison result. In addition, the oscillator 106 and the reference oscillator 1082 are delay time oscillators, resistor capacitor (RC) oscillators, or a combination thereof.

Figure 2A:
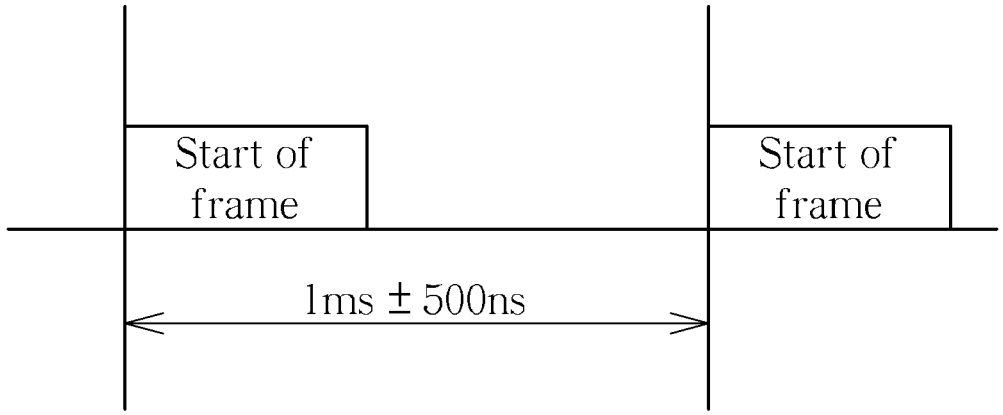
FIG. 2A and FIG. 2B are diagrams illustrating a frame interval of the full-speed Universal Serial Bus and a frame interval of the high-speed Universal Serial Bus defined in a protocol of a USB specification version 2.0.
Figure 2B:
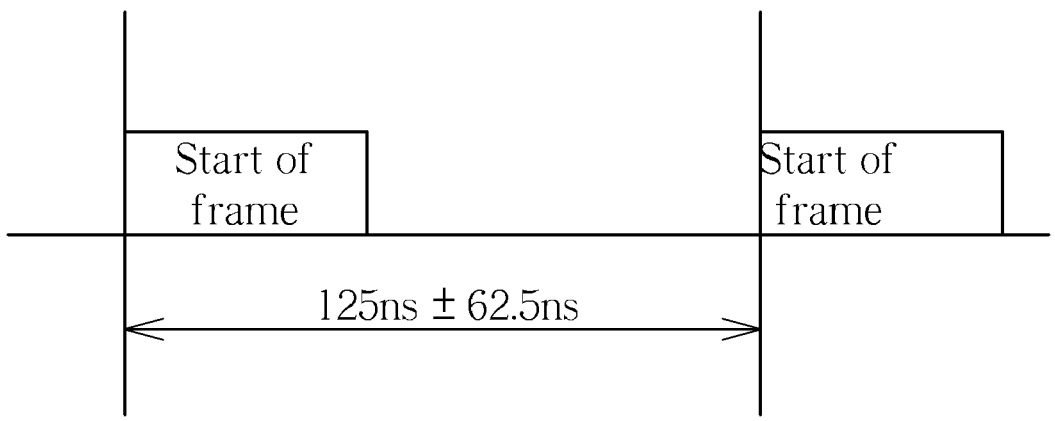

Please refer to FIG. 2A and FIG. 2B. FIG. 2A and FIG. 2B are diagrams illustrating a frame interval of the full-speed Universal Serial Bus and a frame interval of the high-speed Universal Serial Bus defined in a protocol of a USB specification version 2.0. As shown in FIG. 2A, the frame interval of the full-speed Universal Serial Bus is 1.000 ms±500 ns long. As shown in FIG. 2B, the frame interval of the high-speed Universal Serial Bus is 125 us±62.5 ns long. Because the above mentioned errors of the frame intervals meet a frequency error requirement (±500 ppm) of the USB specification version 2.0, a user may use the frame interval of the full-speed Universal Serial Bus and/or the frame interval of the high-speed Universal Serial Bus as a basis for calibrating frequency.

Figures 3A, 3B:
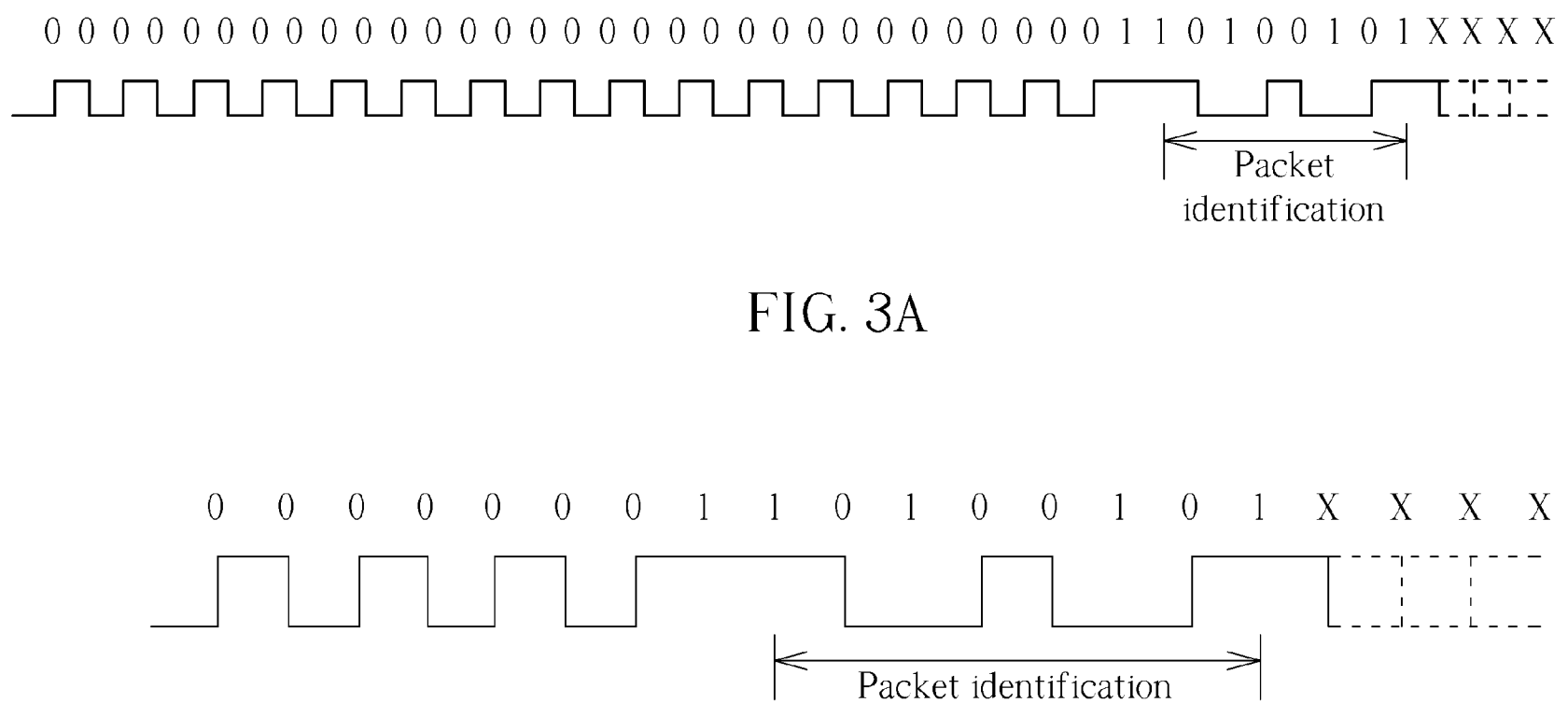

Please refer to FIG. 3A and FIG. 3B. FIG. 3A and FIG. 3B are diagrams illustrating determination of packet identifications by the packet identification unit 104 in the full-speed Universal Serial Bus and the high-speed Universal Serial Bus. As shown in FIG. 3A and FIG. 3B, patterns of the packet identifications of the full-speed Universal Serial Bus and the high-speed Universal Serial Bus are both eight-bit data equaling 10100101. Therefore, the packet identification unit 104 can identify the packet identification of the start of the each frame of the series of digital data generated by the serial interface engine 102 according to the pattern of the packet identification.

Please refer to FIG. 1, FIG. 2A, and FIG. 2B. After the packet identification unit 104 identifies the packet identification, the first period T1 (that is, the frame intervals of the full-speed Universal Serial Bus and the high-speed Universal Serial Bus) between two consecutive packet identifications is identified according to a reset and locking in-phase method. The first counter 1084 generates the first number of clocks C1 according to the first period T1 and the reference oscillation frequency of the reference oscillator 1082, and transmits the first number of clocks C1 to the comparator 1090. In addition, as shown in FIG. 2A, the frequency divider 1086 divides the output frequency f1 (12 MHz) of the oscillator 106 by 3000 (high-speed USB) to generate the second period T2. As shown in FIG. 2B, the frequency divider 1086 divides the output frequency f1 (12 MHz) of the oscillator 106 by 24000 (full-speed USB) to generate the second period T2. Then, the second counter 1088 generates the second number of clocks C2 according to the second period T2 and the reference oscillation frequency of the reference oscillator 1082, and transmits the second number of clocks C2 to the comparator 1090. The comparator 1090 generates the comparison result when the absolute value of the difference between the first number of clocks C1 and the second number of clocks C2 is greater than a predetermined threshold TH. The controller 1092 generates a calibration signal E1 to calibrate the output frequency f1 of the oscillator 106 according to the comparison result.

Figure 4:
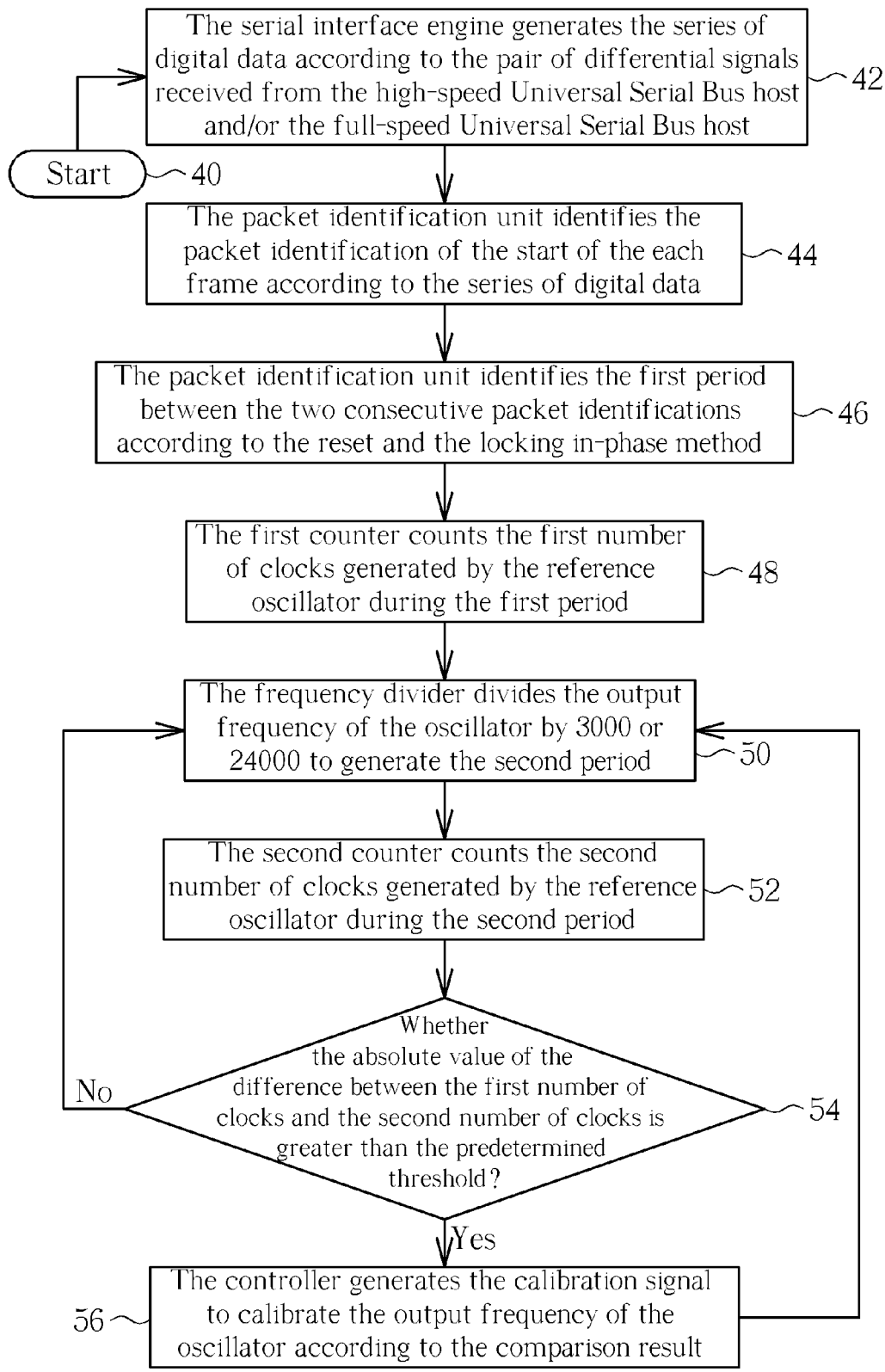
FIG. 4 is a flowchart illustrating a method for automatically calibrating the frequency of the oscillator by utilizing the packet identification of the high-speed USB and/or the packet identification of the full-speed USB.

Please refer to FIG. 4. FIG. 4 is a flowchart illustrating a method for automatically calibrating the frequency of the oscillator 106 by utilizing the packet identification of the high-speed USB and/or the packet identification of the full-speed USB. FIG. 4 uses the frequency calibration circuit 100 in FIG. 1 to illustrate the method. Detailed steps are as follows:

Step 40: Start.

Step 42: The serial interface engine 102 generates the series of digital data according to the pair of differential signals received from the high-speed Universal Serial Bus host 110 and/or the full-speed Universal Serial Bus host 110.

Step 44: The packet identification unit 104 identifies the packet identification of the start of the each frame according to the series of digital data.

Step 46: The packet identification unit 104 identifies the first period T1 between the two consecutive packet identifications according to the reset and the locking in-phase method.

Step 48: The first counter 1084 counts the first number of clocks C1 generated by the reference oscillator 1082 during the first period T1.

Step 50: The frequency divider 1086 divides the output frequency of the oscillator 106 by 3000 (high-speed USB) or 24000 (full-speed USB) to generate the second period T2.

Step 52: The second counter 1088 counts the second number of clocks C2 generated by the reference oscillator 1082 during the second period T2.

Step 54: The comparator 1090 compares the first number of clocks C1 with the second number of clocks C2. If the absolute value of the difference between the first number of clocks C1 and the second number of clocks C2 is greater than the predetermined threshold TH, the comparator 1090 generates the comparison result and proceeds to Step 56; if not, go to Step 50.

Step 56: The controller 1092 generates the calibration signal E1 to calibrate the output frequency f1 of the oscillator 106 according to the comparison result; go to Step 50.

As shown in the method of FIG. 4, the frequency divider 1086, the second counter 1088, the comparator 1090, the controller 1092, and the oscillator 106 form a loop for automatically calibrating the output frequency f1 of the oscillator 106. Therefore, when the output frequency f1 of the oscillator 106 is shifted and the absolute value of the difference between the first number of clocks C1 and the second number of clocks C2 is greater than the predetermined threshold TH, the output frequency f1 of the oscillator 106 is calibrated by the above mentioned loop.

To sum up, the prior art stores the corrected parameters in non-volatile memory during production of the non-volatile memory or uses laser trimming to calibrate the output frequency of the oscillator, but the prior art still does not meet a requirement of a high-speed digital system. The frequency calibration circuit for automatically calibrating frequency and method thereof utilize the packet identification of the start of the frame of the high-speed Universal Serial Bus and/or the full-speed Universal Serial Bus to calibrate the output frequency of the oscillator. Therefore, the present invention can meet the frequency error requirement (±500 ppm) of the USB specification version 2.0 without significantly changing the present circuit design.

Those skilled in the art will readily observe that numerous modifications and alterations of the device and method may be made while retaining the teachings of the invention.

What is claimed is:

1. A method for automatically calibrating frequency, the method comprising:

generating a series of digital data according to a pair of differential signals received from a high-speed Universal Serial Bus (USB) host and/or a full-speed Universal Serial Bus (USB) host;

identifying a packet identification (PID) of a start of each frame according to the series of digital data;

counting a first number of clocks generated by a reference oscillator during a first period between two consecutive packet identifications;

dividing an output frequency of an oscillator by a predetermined number to generate a second period;

counting a second number of clocks generated by the reference oscillator during the second period;

generating a comparison result according to a difference between the first number of clocks and the second number of clocks; and generating a calibration signal to calibrate the output frequency of the oscillator according to the comparison result.

2. The method of claim 1, wherein the first period is identified according to a reset and locking in-phase method.

3. The method of claim 1, wherein the predetermined number is 3000 or 24000.

4. The method of claim 1, wherein generating the comparison result according to the difference between the first number of clocks and the second number of clocks is generating the comparison result when the difference is greater than a predetermined threshold.

5. The method of claim 1, wherein the packet identification is eight-bit data equaling 10100101.

6. A frequency calibration circuit for automatically calibrating frequency, the frequency calibration circuit comprising:

a serial interface engine for generating a series of digital data according to a pair of differential signals received from a high-speed Universal Serial Bus host and/or a full-speed Universal Serial Bus host;

a packet identification unit for identifying a packet identification of a start of each frame and a first period between two consecutive packet identifications according to the series of digital data;

an oscillator; and a count comparator for generating a calibration signal to calibrate an output frequency of the oscillator according to the first period, wherein the count comparator comprises:

a reference oscillator;

a first counter for counting a first number of clocks generated by the reference oscillator during the first period;

a frequency divider for dividing the output frequency of the oscillator by a predetermined number to generate a second period;

a second counter for counting a second number of clocks generated by the reference oscillator during the second period;

a comparator for generating a comparison result according to a difference between the first number of clocks and the second number of clocks; and a controller for generating a calibration signal to calibrate the output frequency of the oscillator according to the comparison result.

7. The frequency calibration circuit of claim 6, wherein the packet identification unit identifies the first period according to a reset and locking in-phase method.

8. The frequency calibration circuit of claim 6, wherein the predetermined number is 3000 or 24000.

9. The frequency calibration circuit of claim 6, wherein the reference oscillator is a delay time oscillator.

10. The frequency calibration circuit of claim 6, wherein the reference oscillator is an RC oscillator.

11. The frequency calibration circuit of claim 6, wherein the oscillator is a delay time oscillator.

12. The frequency calibration circuit of claim 6, wherein the oscillator is an RC oscillator.

13. The frequency calibration circuit of claim 6, wherein the packet identification is eight-bit data equaling 10100101.

\* \* \* \* \*